United States Patent
Yamazaki

[11] Patent Number: 6,057,588
[45] Date of Patent: May 2, 2000

[54] SEMICONDUCTOR INTEGRATED CIRCUIT DEVICE WITH DIGITAL CIRCUIT AND ANALOG CIRCUIT ON COMMON SUBSTRATE AND FABRICATION PROCESS THEREFOR

[75] Inventor: Toru Yamazaki, Tokyo, Japan

[73] Assignee: NEC Corporation, Tokyo, Japan

[21] Appl. No.: 08/884,191

[22] Filed: Jun. 27, 1997

[30] Foreign Application Priority Data

Jun. 27, 1996 [JP] Japan ................................ 8-167684

[51] Int. Cl.[7] .......................... H01L 29/76; H01L 29/00; H01L 29/94
[52] U.S. Cl. .......................... 257/506; 257/370; 257/378; 257/501; 257/548
[58] Field of Search .................................. 257/370, 378, 257/338, 392, 500, 501, 506, 544, 548

[56] References Cited

U.S. PATENT DOCUMENTS

| | | | |
|---|---|---|---|
| 4,246,594 | 1/1981 | Mori | 357/48 |
| 5,091,760 | 2/1992 | Maeda et al. | 357/23.4 |
| 5,317,183 | 5/1994 | Hoffman et al. | 257/369 |
| 5,459,349 | 10/1995 | Kobatake | 257/659 |
| 5,525,824 | 6/1996 | Himi et al. | 257/370 |
| 5,623,159 | 4/1997 | Monk et al. | 257/509 |

FOREIGN PATENT DOCUMENTS

| | | |
|---|---|---|
| 2-14549 | 1/1990 | Japan . |
| 3-148852 | 6/1991 | Japan . |
| 4-251970 | 9/1992 | Japan . |

OTHER PUBLICATIONS

Patent Abstracts of Japan, JP–02 271567, Nov. 1990.
Patent Abstracts of Japan, JP–06 053311, Feb. 1994.

*Primary Examiner*—Mahshid D. Saadat
*Assistant Examiner*—Jesse A. Fenty
*Attorney, Agent, or Firm*—Foley & Lardner

[57] ABSTRACT

A semiconductor layer is formed on a semiconductor substrate. A digital circuit region, in which a digital circuit is formed, and an analog circuit region, in which an analog circuit is formed, are separately formed by an isolation region at the surface of the semiconductor layer. At this time, a width of the semiconductor layer in the isolation region is greater than a thickness of the semiconductor substrate. Also, a region having high electrical resistance with low concentration of impurity is formed at the surface of the semiconductor substrate in the isolation region. Furthermore, conductive layers connected to a grounding potential is formed on the backside of the semiconductor substrate in the digital circuit region and on the backside of the semiconductor substrate of the analog region.

20 Claims, 12 Drawing Sheets

SEMICONDUCTOR INTEGRATED CIRCUIT DEVICE WITH DIGITAL CIRCUIT AND ANALOG CIRCUIT ON COMMON SUBSTRATE AND FABRICATION PROCESS THEREFOR

BACKGROUND OF THE INVENTION

1. Field of the Invention

The present invention relates to a semiconductor integrated circuit device with a digital circuit and an analog circuit on a common substrate, with a structure restricting cross-talk between the respective circuits via a semiconductor substrate, and a fabrication process therefor.

2. Description of the Prior Art

According to improvement of performance of a CMOS integrated circuit and a bipolar integrated circuit, silicon type integrated circuits have been used even in high operation frequency of GHz band. However, the silicon substrate has low insulation ability for its low resistance different from GaAs substrate typically used in the high operation frequency of GHz band. Therefore, there is relatively high possibility that an electrical signal generated in a certain element affects other elements via the substrate. Particularly, a signal generated in the digital circuit tends to flow into the analog circuit via the silicon substrate to cause degradation of analog characteristics in a semiconductor integrated circuit device, in which a digital circuit and an analog circuit are present on a common substrate. This phenomenon is referred to as substrate cross-talk which has been a serious problem in an integrated circuit, in which the digital circuit and the analog circuit are present on a common substrate. Therefore, how to restrict the cross-talk is a quite important factor to improve high frequency characteristics of the semiconductor integrated circuit device for expanding the applicable field in a high frequency range.

Therefore, there has been proposed an integrated circuit which can lower substrate cross-talk (Japanese Unexamined Patent Publication No. Hei 2-14549). FIG. 1 is a section showing a conventional semiconductor integrated circuit device, in which a digital circuit and an analog circuit are present on a common substrate. In this art, an analog circuit region 246 and a digital circuit region 248 are formed at the surface of a low concentration p-type silicon substrate 260. An oxide 272 is formed between the analog circuit region 246 and the digital circuit region 248 for isolating the analog circuit region 246 and the digital circuit region 248 from each other. Also, a high concentration p-type channel stopping high concentration region 265 is formed between the analog circuit region and the oxide 272. A grounding lead 267 connected to a grounding potential is formed on the channel stopper high concentration region 265. Similarly, a p-type channel stopping high concentration region 266 and a grounding lead 268 are formed between the digital circuit region 248 and the oxide 272. Then, an analog circuit transistor 270a, which is constructed with an n⁺ region 271a formed on the silicon substrate 260 and a base 272a, an emitter 273a, a collector 274a and an epitaxial layer 275a formed on the n⁺ region 271a, is formed in the analog circuit region 246. On the other hand, a digital circuit transistor 270b, which is constructed with an n⁺ region 271b formed on the silicon substrate 260 and a base 272b, an emitter 273b, a collector 274b and an epitaxial layer 275b formed on the n⁺ region 271b, is formed in the digital circuit region 248.

With this art, the oxide 272 having high resistance is present between the analog circuit region 246 and the digital circuit region 248. Therefore, a charge flowing between the analog circuit transistor 270a and the digital circuit transistor 270b can be reduced.

However, in the foregoing art, since a distance between the channel stopping high concentration regions 265 and 266 is narrow, resistance of the substrate 260 between the analog circuit transistor 270a and the digital circuit transistor 270b cannot be sufficiently high. Therefore, an effect of restricting cross-talk cannot be satisfactory. Cross-talk includes not only a charge flowing through the surface of the silicon substrate but also a charge flowing through the inside of the silicon substrate. In the foregoing art, while a charge flowing through the surface of the silicon substrate can be restricted, it may not be able to restrict a charge flowing through the inside of the silicon substrate.

The most efficient method in restricting cross-talk through the inside of the silicon substrate is to increase resistance of a silicon substrate per se. This can be achieved by using silicon having higher purity. A silicon substrate is produced by cutting a single crystalline silicon ingot. There are two methods, i.e. a CZ (Czochralski) method and an FZ (floating zone) method, for producing a single crystalline silicon ingot. The CZ method is a method to melt a silicon in a quartz melting pot, and a seed crystal of single crystalline silicon is soaked in the molten silicon and drawn up. This method is suitable for increasing the diameter of the ingot. However, since an impurity from the quartz melting pot may be admixed to lower resistance. Normally, specific resistance of a single crystalline silicon produced from the CZ method is not more than 50 ($\Omega$·cm). On the other hand, upon solidifying the molten silicon, the impurity can precipitated to make the specific resistance non-uniform.

On the other hand, in the FZ method, a single crystalline silicon ingot is produced by vertically setting a polycrystalline silicon bar with a seed crystal of single crystalline silicon seeded at the upper end with both ends fixed, locally heating the seeded portion for melting and shifting the melting zone downwardly from the upper end. In this method, a single crystalline silicon ingot having high purity and high resistance can be produced without possibility of admixing of an impurity. However, difficulty is encountered in increasing the diameter of the single crystalline silicon bar. Therefore, it is quite difficult to produce a large diameter silicon substrate at high specific resistance higher than or equal to 50 ($\Omega$·cm).

Therefore, another method for restricting cross-talk through the silicon substrate has been proposed (Japanese Unexamined Patent Publication No. Hei 4-251970). FIG. 2 is a section showing a conventional integrated circuit device, in which an analog circuit and a digital circuit are present on a common substrate. In this art, an n-type well region 312 for a digital circuit and an n-type well region 314 for an analog circuit are separately formed at the surface of a p-type silicon substrate 310. A p-channel MOS transistor and a p-type well region 315 are formed in the n-type well region 312. Also, an n-channel MOS transistor is formed in the p-type well region 315. Thus, a CMOS digital circuit is constructed with the p-channel MOS transistor and the n-channel MOS transistor. On the other hand, a p-channel MOS transistor and a p-type well region 318 are formed in the n-type well region 314. Also, an n-channel MOS transistor is formed in the p-type well region 318. Thus, a CMOS analog circuit is constructed with the p-channel MOS transistor and the n-channel MOS transistor. On the other hand, an n⁺ region 324 or a p⁺ region 326 are formed in the respective well regions 312, 314, 315 and 318. A power source potential $V_{cc}$ or a grounding potential GND is supplied through the n+ region 324 or the p+ region 326. Also, a grounding potential GND is supplied via a p+ region 328 to the p-type substrate 310.

With this art, the digital circuit region and the analog circuit region are separately formed in the n-type well region 312 and the n-type well region 314 respectively. The n-type well regions 312 and 314 are connected to a fixed potential, and isolated from each other by the substrate 310. Therefore, it can be successfully prevented to cause cross-talk between the digital circuit region and the analog circuit region.

However, when this structure is applied in a bipolar transistor circuit, operation characteristics of the circuit: can be degraded due to large parasitic capacitance. Therefore, the field of application of this technology is currently restricted only to a MOS transistor. Also, since the power source potential $V_{cc}$ or the grounding potential GND is applied to the respective well regions 312, 314, 315 and 318 via the n+ region 326 or the p+ region 328, excessive current to respective well regions is absorbed. However, a wiring for the power source and a wiring for the grounding potential are on the same plan as the other circuit wirings. Therefore, a wiring region for the power source and the grounding potential is necessary in addition to a wiring region for the other circuit wirings to cause increasing of the area of the integrated circuit.

On the other hand, there has been proposed a method for suppressing substrate cross-talk without increasing capacitance between a collector and a substrate even in a bipolar transistor (Japanese Unexamined Patent Publication No. Hei 3-148852). FIG. 3 is a section showing a conventional integrated circuit device, in which a digital circuit and an analog circuit are present on a common substrate. In this art, a silicon layer 406 is bonded on a silicon substrate 402 via an oxide layer 404 to form a SOI (Silicon On Insulator) structure. A portion where a digital circuit is to be formed and a portion where an analog circuit is to be formed are provided in the silicon layer 406 formed on the oxide layer 404. Also, an oxide layer 408 with a groove is formed between these portions. A conductive layer 410 is buried within the groove. The conductive layer 410 is connected to a grounding potential.

With this art, since the digital circuit and the analog circuit are separated by the oxide layer 408 as insulator, cross-talk can be suppressed. Also, since the inside of the groove between these circuits is fixed at a grounding potential, capacitive coupling between the digital circuit and the analog circuit can also be prevented successfully.

However, even in this structure, an electric signal may flow between the digital circuit and the analog circuit via thus silicon substrate 402 due to capacitive coupling via the oxide layer 404. The cross-talk thus caused cannot be prevented.

SUMMARY OF THE INVENTION

It is an object of the present invention to provide a semiconductor integrated circuit device with a digital circuit and an analog circuit present on a common substrate, which can successfully avoid cross-talk between the digital circuit and the analog circuit, and a fabrication process therefor.

A semiconductor integrated circuit device with a digital circuit and an analog circuit on a common substrate, according to the present invention, includes an integrated circuit substrate. The integrated circuit substrate of the first aspect of the present invention has a semiconductor substrate, a first well region formed at the surface of the integrated circuit substrate, in which the digital circuit is formed, a second well region formed at the surface of the integrated circuit substrate, in which the analog circuit is formed, and an isolation region formed between the first well region and the second well region. It should be noted that the isolation region has a greater width than a thickness of the semiconductor substrate.

According to the first aspect of the present invention, since the isolation region has a greater width than a thickness of the semiconductor substrate, even if abrupt variation of voltage is caused in the digital circuit region, a noise generated by such abrupt variation can be disappeared before reaching the analog circuit.

An integrated circuit substrate according to the second aspect of the present invention has a semiconductor substrate and a semiconductor layer formed on the semiconductor substrate. There are a first well region, in which the digital circuit is formed, a second well region, in which the analog circuit is formed, and an isolation region between the first well region and the second well region at the surface of the semiconductor layer. It should be noted that the first well region has a well which includes a circuit element and a fixed potential region. The fixed potential region is located between the isolation region and the circuit element, and connected to a fixed potential.

According to the second aspect of the present invention, since the fixed potential region is located between the isolation region and the circuit element, and connected to a fixed potential, a charge leaking from the circuit element can be captured and absorbed. Thus, influence from the digital circuit region to the analog circuit region can be suppressed.

An integrated circuit substrate according to the third aspect of the present invention has a semiconductor substrate and a semiconductor layer formed on the semiconductor substrate. There are a first well region, in which the digital circuit is formed, a second well region, in which the analog circuit is formed, and an isolation region between the first well region and the second well region at the surface of the semiconductor layer. It should be noted that a first electrode is formed on the backside of a portion of the semiconductor substrate, in which the first well region is located, and that a second electrode is formed on the backside of a portion of the semiconductor substrate, in which the second well region is located.

According to the third aspect of the present invention, the first electrode and the second electrode are separately formed from each other. If the electrode formed on the backside of the substrate in the digital circuit region and the electrode formed on the backside of the substrate in the analog circuit are integrated, a noise can be propagated from the digital circuit to the analog circuit. The noise can be satisfactorily suppressed by separating the first electrode and the second electrode from each other.

An integrated circuit substrate of the fourth aspect of the present invention has a semiconductor substrate of a first conductivity type and a semiconductor layer formed on the semiconductor substrate. There are a first well region, in which the digital circuit is formed, a second well region, in which the analog circuit is formed, and an isolation region between the first well region and the second well region at the surface of the semiconductor layer. A first well of the first conductive type, which is located adjacent to the isolation region, and a second well of a second conductive type, which is located adjacent to the first well away from the isolation region, are formed in the first well region. A third well of the second conductive type, which is located adjacent to the isolation region, and a fourth well of the first conductive type, which is located adjacent to the third well away from the isolation region, are formed in the second well region.

According to the fourth aspect of the present invention, the fourth well in the analog circuit region, whose conductive type is the same as that of the semiconductor substrate, is located away from the digital circuit region. Thus, a noise generated in the digital circuit region can be satisfactorily suppressed.

An integrated circuit substrate according to the fifth aspect of the present invention has a semiconductor substrate, an insulation layer formed on the semiconductor substrate and a semiconductor layer on the insulation layer. There are a first well region, in which the digital circuit is formed, a second well region, in which the analog circuit is formed, and an isolation region between the first well region and the second well region at the surface of the semiconductor layer.

According to the fifth aspect of the present invention, the insulation layer is formed on the semiconductor substrate. Therefore, the device has an SOI structure. Since there is the insulation layer between the semiconductor layer and the semiconductor substrate, propagation of a charge between the semiconductor layer and the semiconductor substrate can be reduced.

A fabrication process of a semiconductor integrated circuit device with a digital circuit and an analog circuit on a common substrate, according to the present invention, comprises a step of performing selective ion implantation of an impurity of a second conductivity type in a semiconductor substrate of a first conductivity type at an injection angle of substantially 0°. In the foregoing step, a digital circuit region, in which the digital circuit is to be formed, and an analog circuit region, in which the analog circuit is to be formed, are defined. Then, a semiconductor layer is deposited over the entire surface. Next, the digital circuit is formed in the digital circuit region in the semiconductor layer. Then, the analog circuit is formed in the analog circuit region in the semiconductor layer.

With the fabrication process, according to the present invention, since ion implantation is performed at an injection angle of substantially 0°, channeling phenomenon can be caused in the silicon crystal for the impurity to be implanted at deeper depth. Therefore, a deep high resistance region can be formed to effectively suppress propagation of noise current. It should be noted that, by performing ion implantation for a plurality of times at different injection energy, the impurity concentration can be made uniform in the deeper range to effectively suppress the noise current.

A fabrication process of a semiconductor integrated circuit device with a digital circuit and an analog circuit on a common substrate, according to another aspect of the present invention, comprises a step of performing selective ion implantation of an impurity of a second conductivity type in a semiconductor substrate of a first conductivity type at an injection angle of substantially 0°. In the foregoing step, a digital circuit region, in which the digital circuit is to be formed, an analog circuit region, in which the analog circuit is to be formed, and an isolation region, by which the digital circuit region and the analog circuit region are separated from each other, are defined. Next, an insulator is formed over the entire surface. Then, a semiconductor layer is bonded over the entire surface. Next, the digital circuit is formed in the digital circuit region in the semiconductor layer. Then, the analog circuit is formed in the analog circuit region in the semiconductor layer.

With the fabrication process, according to another aspect of the present invention, a semiconductor integrated circuit device of an SOI structure can be constructed.

According to the present invention, in a semiconductor integrated circuit device with a digital circuit and an analog circuit on a common substrate in admixing manner, crosstalk between the digital circuit and the analog circuit, particularly from the digital circuit to the analog circuit, can be effectively avoided.

BRIEF DESCRIPTION OF THE DRAWINGS

The present invention will be understood more fully from the detailed description given hereinafter and from the accompanying drawings of the preferred embodiments of the present invention, which, however, should not be taken to be limitative to the present invention, but are for explanation and understanding only.

In the drawings:

FIGS. 4A and 4B illustrate the first embodiment of a semiconductor integrated circuit device according to the present invention, in which FIG. 4A is a section and FIG. 4B is a plan view;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscuring the present invention.

Figure 1:
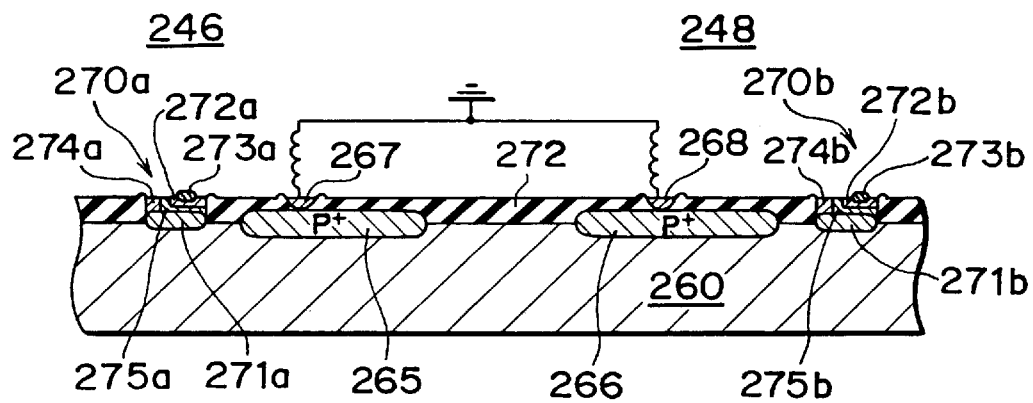
FIG. 1 is a section showing one example of a conventional integrated circuit device, in which a digital circuit and an analog circuit are present on a common substrate.
Figure 2:
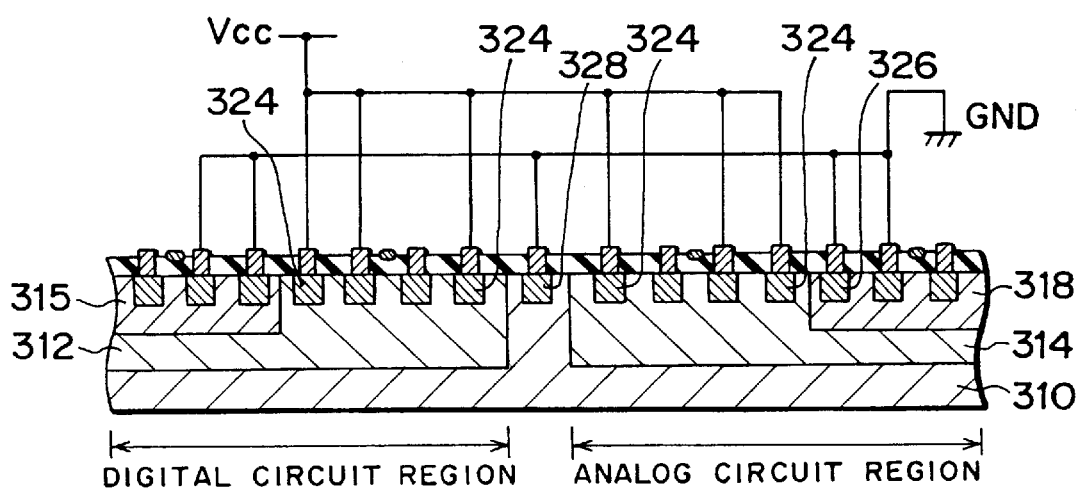
FIG. 2 is a section showing another example of a conventional integrated circuit device, in which a digital circuit and an analog circuit are present on a common substrate.
Figure 3:
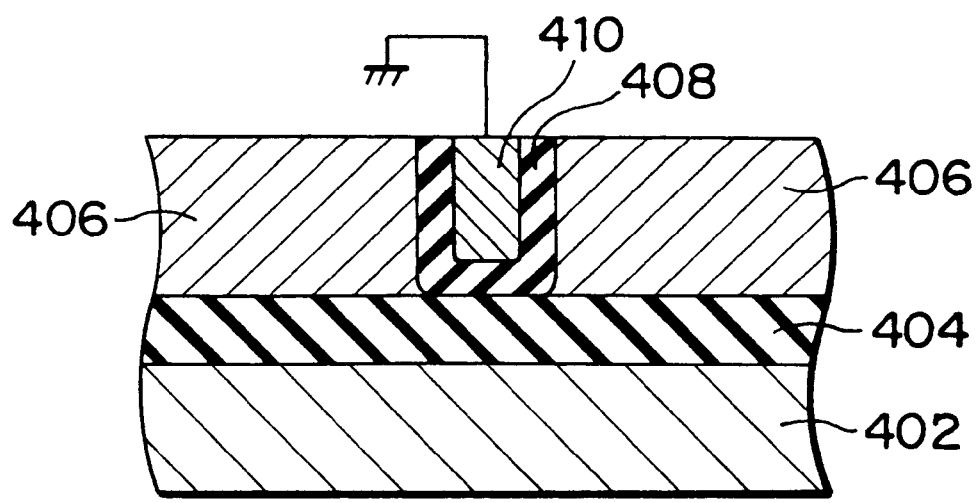
FIG. 3 is a section showing a further example of a conventional integrated circuit device, in which a digital circuit and an analog circuit are present on a common substrate.
Figure 4A:
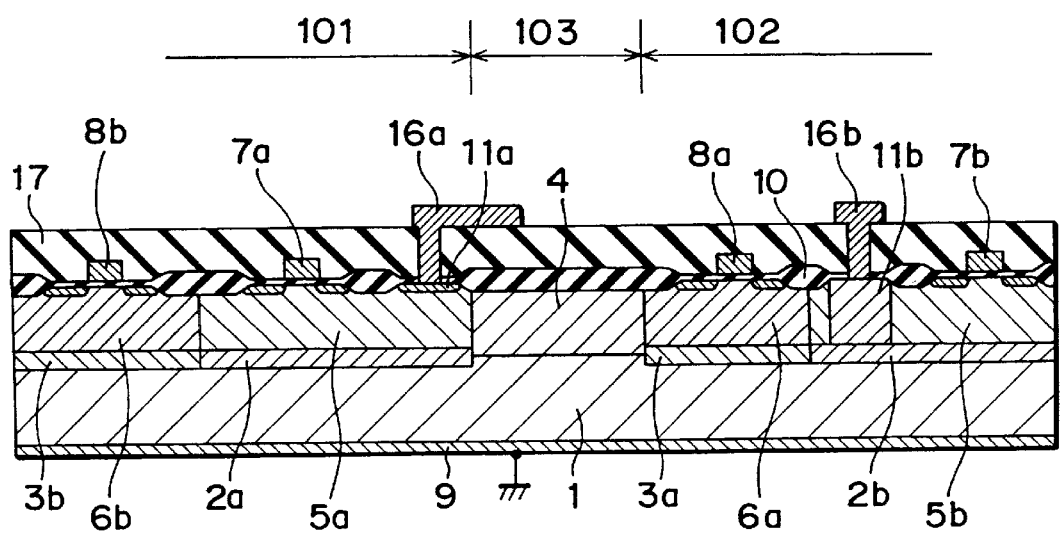
Figure 4B:
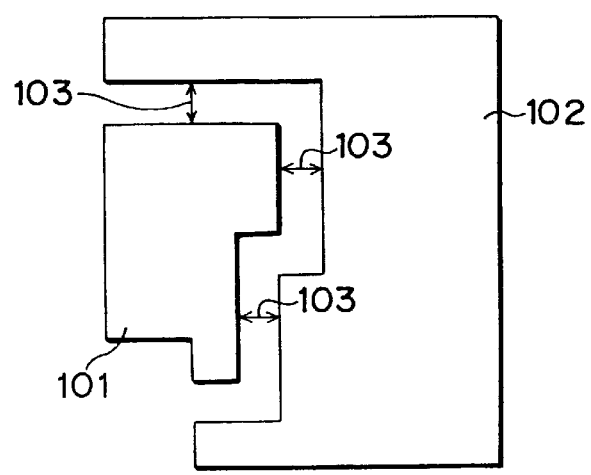

FIGS. 4A and 4B show the first embodiment of a semiconductor integrated circuit device according to the present invention, in which FIG. 4A is a section and FIG. 4B is a plan view. In the shown embodiment, as shown in FIGS. 4A and 4B, a digital circuit region 101 and an analog circuit region 102 are separated by an isolation region 103.

First, discussion will be given with respect to the digital circuit region 101. A p-type buried layer 2a contacting with the isolation region 103 at one side and an n-type buried layer 3b contacting with another side of the p-type buried layer 2a are formed on the surface of a p-type silicon substrate 1 in the digital circuit region 101. A p-type well 5a is formed on the p-type buried layer 2a. Similarly, an n-type well 6b is formed on the n-type buried layer 3b. An n-channel MOS transistor 7a consisted of an n-type source diffusion layer, an n-type drain diffusion layer, a gate electrode and a gate oxide layer is formed at the surface of the p-type well 5a. On the other hand, a p-channel MOS transistor 8b consisted of a p-type source diffusion layer, a p-type drain diffusion layer, a gate electrode and a gate oxide layer is formed at the surface of the n-type well 6b. Also, a guarding region 11a having higher impurity concentration than the p-type well 5a is formed on the side of the isolation region 103 off the n-channel MOS transistor 7a via a isolation oxide layer at the surface of the p-type well 5a. On the other hand, between the elements, isolation oxide layers are formed. Thus, a CMOS digital circuit constructed with the n-channel MOS transistor 7a and the p-channel MOS transistor 8b is formed.

Next, discussion will be given with respect to the analog circuit region 102. An n-type buried layer 3a contacting with the isolation region 103 at one side and a p-type buried layer 2b contacting with another side of the n-type buried layer 3a are formed on the surface of the p-type silicon substrate 1 in the analog circuit region 102. An n-type well 6a is formed on the n-type buried layer 3a. Similarly, a p-type well 5b is formed on the p-type buried layer 2b. A p-channel MOS transistor 8a consisted of a p-type source diffusion layer, a p-type drain diffusion layer, a gate electrode and a gate oxide layer is formed at the surface of the n-type well 6a. On the other hand, an n-channel MOS transistor 7b consisted of an n-type source diffusion layer, an n-type drain diffusion layer, a gate electrode and a gate oxide layer is formed at the surface of the p-type well 5b. Also, a guarding region 11b having higher impurity concentration than the p-type well 5b and reaching to the p-type buried layer 2b is formed on the side of the n-type well 6a off the n-channel MOS transistor 7b via a isolation oxide layer at the surface of the p-type well 5b. The guarding region 11b is fixed at a minimum potential, such as a grounding potential or the like. On the other hand, isolation oxide layers are formed between the elements. On the other hand, a maximum potential, such as a power source potential or the like, is applied to the n-type well 6a. Thus, a CMOS analog circuit constructed with the n-channel MOS transistor 7b and the p-channel MOS transistor 8a is formed.

Then, an n-type epitaxial layer 4 having a width greater than a thickness of the p-type silicon substrate 1, such as 300 to 600 μm or more, for example, is formed on the p-type silicon substrate 1 in the isolation region 103. Also, an isolation oxide layer 10 is formed on the epitaxial layer 4.

An interlayer insulation layer 17 is formed over respective elements and the isolation oxide layers. Wiring 16a and 16b respectively reaching the guarding regions 11a and 11b are formed in the interlayer insulation layer 17. On the other hand, a backside electrode 9 of aluminum is formed on the backside of the p-type silicon substrate 1 and fixed at a grounding potential.

It should be noted that, as shown in FIG. 4B, the occupied area of the analog circuit region 102 is greater than the occupied area of the digital circuit region 101. Also, the analog circuit region 102 is formed surrounding the digital circuit region 101.

In the shown embodiment, since the backside electrode 9 is formed, a noise current leaking to the epitaxial layer 4 or the p-type silicon substrate 1 from the p-type well 5a or the n-type well 6b in the digital circuit region 101 may be drawn and absorbed by an electric field formed by the backside electrode 9 before reaching the p-type well 5b or the n-type well 6a in the analog circuit region 102. Therefore, influence of the noise from the digital circuit region 101 to the analog circuit region 102 can be successfully avoided. Furthermore, since the guarding region 11a is formed for the n-channel MOS transistor 7a and fixed at the minimum potential, a charge leaking from the n-channel MOS transistor 7a can be captured and absorbed. Thus, a charge to be a cause of the noise will reach neither the isolation region 103 nor the analog circuit region 102. Even if a charge reaches the isolation region 103, the charge may not reach the analog circuit region 102 because the width of the isolation region 103 is greater than a thickness of the p-type silicon substrate 1. In addition, since the maximum potential is applied to the n-type well 6a, propagation of a charge is further prevented by a potential barrier formed by the potential applied to the n-type well 6a.

In general, a transistor having a semiconductor layer or a well region of the same conductivity type as the substrate has higher possibility to be influenced by a noise. In the shown embodiment, since the substrate 1 is p-type, the n-channel MOS transistor 7b formed in the p-type well 5b is the one to be easily influenced by the noise. In the shown embodiment, since the n-channel MOS transistor 7b is located away from the digital circuit region 101 than the p-channel MOS transistor 8a, a charge flowing into the p-type silicon substrate 1 or the epitaxial layer 4 will hardly influence to the n-channel MOS transistor 7b. Furthermore, the p-type buried layer 2b and the guarding region 11b are arranged in contact, and the minimum potential, such as a grounding potential, is applied to the guarding region 11b via a power source wiring 16b. Therefore, even if a charge reaches the p-type buried layer 2b, the charge may be absorbed in the guarding region 11b to be prevented from influencing for the n-channel transistor 7b.

Figure 5:
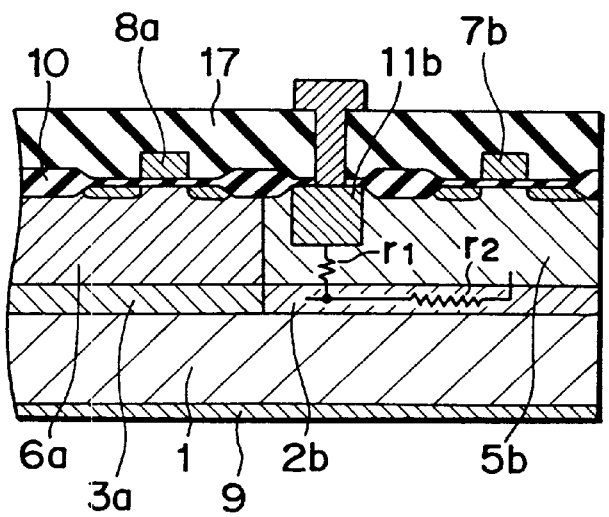
FIG. 5 is a section showing an example where a guarding region 11b is located away from a p-type buried layer 2b.

It should be noted that, in the shown embodiment, while the guarding region 11b formed in the analog circuit region 102 is formed to reach the p-type buried layer 2b, it may be possible that the guarding region 11b is arranged away from the p-type buried layer 2b. In this case, it is preferred that the guarding region 11b is formed to be deeper. FIG. 5 is a section showing an example where the guarding region 11b is arranged away from the p-type buried layer 2b. If the guarding region 11b is formed shallower and resistance r1 between the p-type buried layer 2b and the guarding region 11b is higher than resistance r2 in the p-type buried layer 2b, the charge may flow into the p-type buried layer 2b when a charge reaches the p-type buried layer 2b. As a result, the charge may flow into the n-channel MOS transistor 7b to give influence for the n-channel MOS transistor 7b. Therefore, the guarding region 11b is preferred to be formed deeper to reach the p-type buried layer 2b.

On the other hand, since the guarding region 11a is formed on the side of the isolation region 103 off the n-channel MOS transistor 7a, a wide power source wiring 16a for connecting the guarding region 11a to the minimum potential, such as the grounding potential or so forth, may be formed in the isolation region 103 where a circuit element is not formed, in the shown embodiment. Therefore, the wiring can be formed wide enough to reduce the resistance of the wiring.

It should be noted that, in the shown embodiment, the conductive type of the epitaxial layer 4 may be p-type. However, n-type is preferred since it can form an efficient potential barrier between the silicon substrate 1 and the p-type well 5a. By forming the potential barrier, propagation of a charge which can be a cause of a noise can be successfully suppressed.

It should be noted that a semiconductor to be used as the substrate is not limited to silicon.

Also, it should be noted that a metal to be used as the backside electrode is not limited to aluminum.

Figure 6:
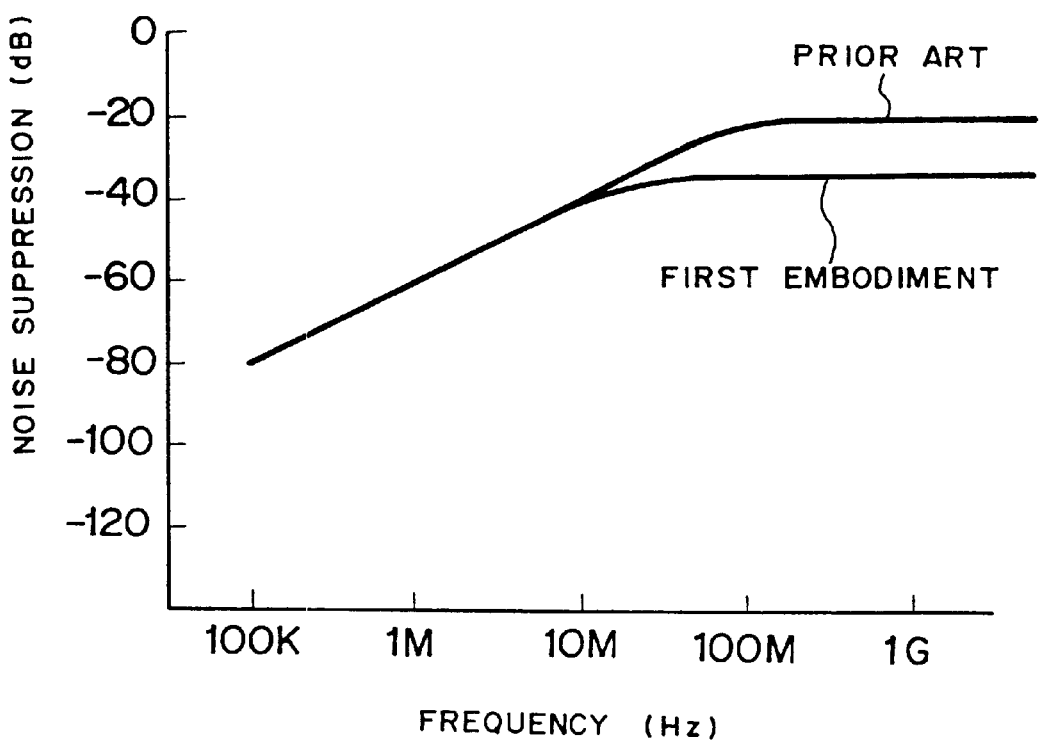
FIG. 6 is a graph showing a difference of noise suppressing effects between the first embodiment and a prior art with taking a frequency in the horizontal axis and a noise suppression in the vertical axis.

FIG. 6 is a graph showing a difference of noise suppression effects between the first embodiment and a prior art with taking a frequency in the vertical axis and a noise suppression in the horizontal axis. With the shown embodiment, in a range of frequency higher than or equal to 10 MHz, a noise can be lowered in a range of 5 to 20 dB in comparison with a prior semiconductor integrated circuit device.

Figure 7:
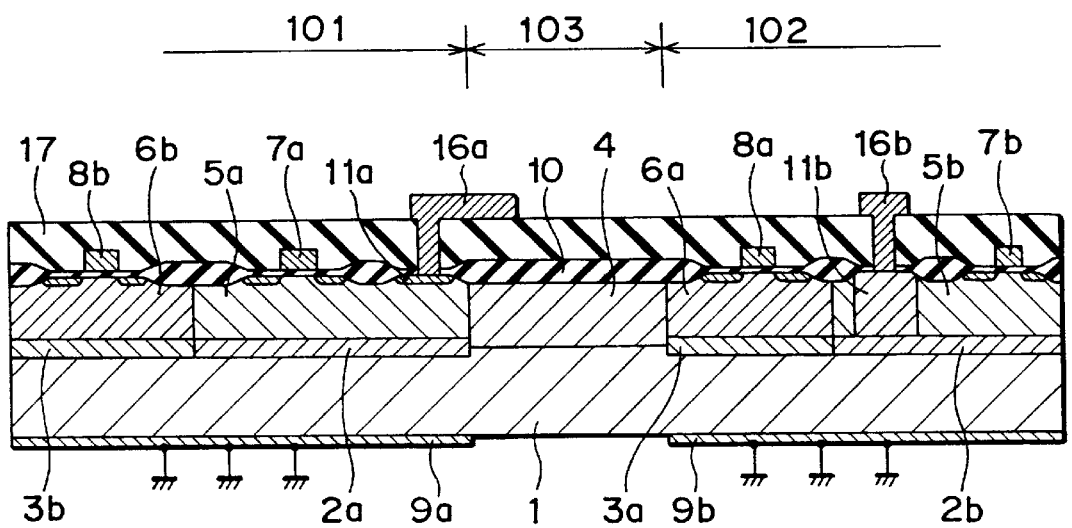
FIG. 7 is a section of the second embodiment of a semiconductor integrated circuit device according to the present invention.

Next, the second embodiment of the present invention will be discussed. FIG. 7 is a section showing the second embodiment of a semiconductor integrated circuit device according to thus present invention. In FIG. 7, like elements to those in FIG. 4A will be identified by like reference numerals, and detailed description therefor will be neglected. A backside electrode 9a of aluminum is formed on the backside of the p-type silicon substrate 1 in the digital circuit region 101. On the other hand, a backside electrode 9b of aluminum is formed on the backside of the p-type silicon substrate 1 in the analog circuit region 102. Also, mutually independent lead lines are connected to the backside electrodes 9a and 9b. These lead lines are connected to a grounding potential. It should be noted that, different from the first embodiment, a backside electrode is not formed in the isolation region 103.

Figure 8:
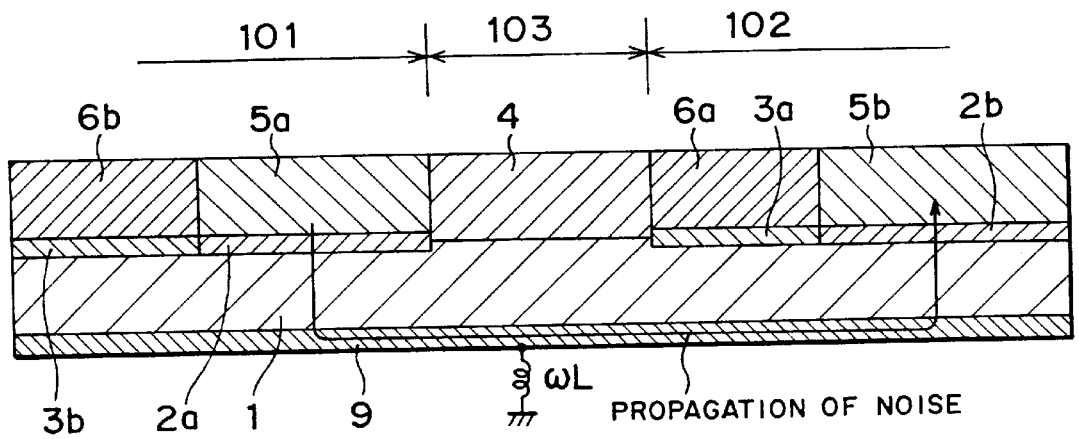
FIG. 8 is a diagrammatic section showing the first embodiment of a semiconductor integrated circuit device.
Figure 9:
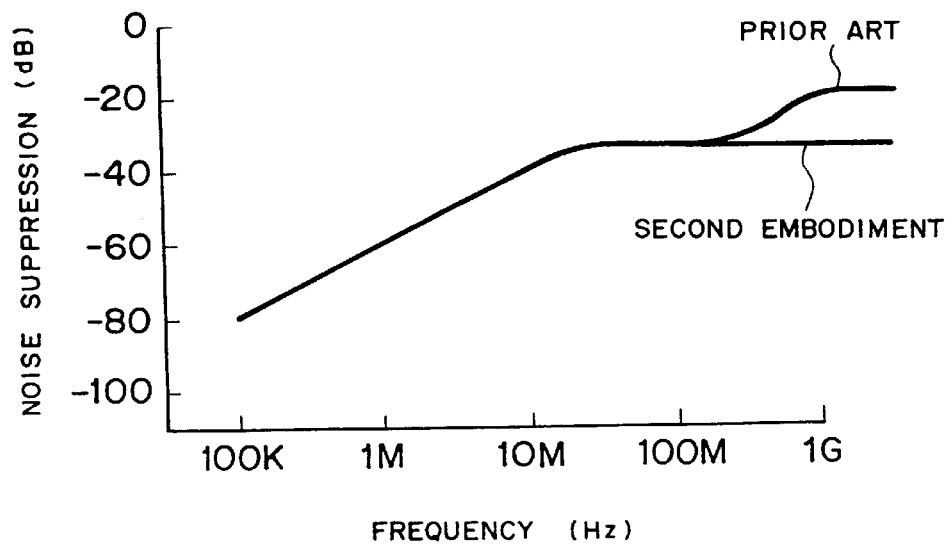
FIG. 9 is a graph showing a difference of noise suppression effects between the second embodiment and a prior art with taking a frequency in the horizontal axis and a noise suppression in the vertical axis.

FIG. 8 is a diagrammatic section showing the first embodiment of a semiconductor integrated circuit device. In the first embodiment, the backside electrode 9 is formed also in the isolation region 103, and thus the backside electrode in the digital circuit region and the backside electrode in the analog circuit region are integrated. Assuming that the lead line connected to the backside electrode 9 has inductance L and that operation frequency is ω, reactance ωL becomes large in the high frequency range. Therefore, the potential of the p-type silicon substrate 1 may be varied. The variation of potential in the substrate should influence to the operation of the analog circuit as a noise. Particularly, since a noise is generated at the rising edge and the falling edge of the signal in the digital circuit, in which a pulse form signal flows, the operation of the analog circuit may be significantly influenced by variation of the potential of the substrate. On the other hand, in case of the second embodiment, since the backside electrode is not formed in the isolation region 103, even if the potential in the digital circuit region 101 is varied, the potential of the analog circuit region 102 is rarely varied correspondingly. In particular, when the p-type silicon substrate 1 has high specific resistance, only little variation of potential may be caused in the p-type silicon substrate 1 in the analog circuit region 102. Also, in the second embodiment, since a plurality of lead lines are connected to the backside electrodes 9a and 9b, inductance of each lead line becomes small. Therefore, reactance also becomes small to further restrict variation of the potential of the p-type silicon substrate 1. FIG. 9 is a graph showing a difference of noise suppression effects between the second embodiment and a prior art with taking a frequency in the horizontal axis and a noise suppression in the vertical axis. In the prior art, influence of a noise appears in the frequency range higher than or equal to 100 MHz. In contrast to this, in the second embodiment, where the backside electrodes are separated, influence of a noise does not appear even in the frequency range higher than or equal to 100 MHz.

Figure 10:
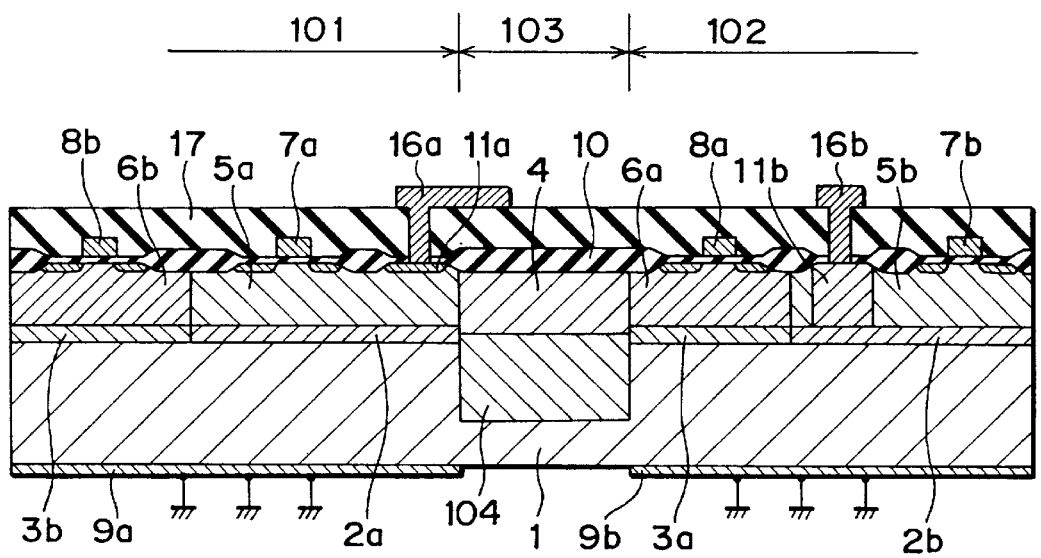
FIG. 10 is a section of the third embodiment of a semiconductor integrated circuit device according to the present invention.

Next, the third embodiment of a semiconductor integrated circuit device according to the present invention will be discussed, FIG. 10 is a section showing the third embodiment of a semiconductor integrated circuit device according to the present invention. In FIG. 10, like elements to those in FIG. 7 will be identified by like reference numerals, and detailed description therefor will be neglected. A surface portion 104 having lower impurity concentration than the p-type silicon substrate 1 is provided in the upper portion of the p-type silicon substrate 1 in the isolation region 103. In the shown embodiment, since the impurity concentration in the surface portion 104 is lower than that in the p-type silicon substrate 1, the specific resistance in the isolation region 103 becomes higher. Therefore, propagation of a charge to be a cause of a noise can be further suppressed. Thus, influence of variation of potential in the digital circuit for the analog circuit becomes further smaller.

Figure 11:
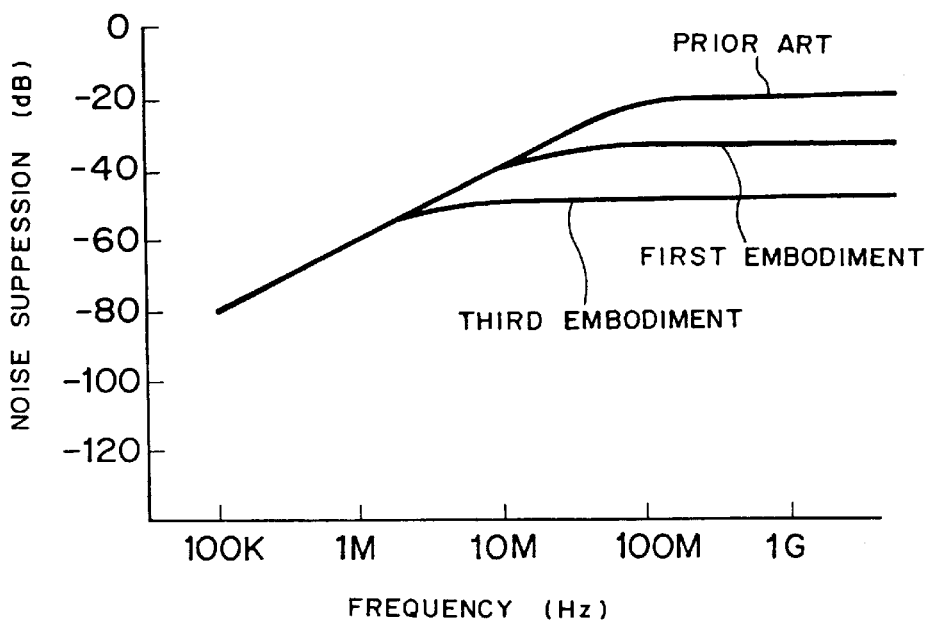
FIG. 11 a graph showing a difference of noise suppression effects among the third embodiment, the first embodiment and a prior art with taking a frequency in the horizontal axis and a noise suppression in the vertical axis.

FIG. 11 is a graph showing a difference of noise suppression effects among the third embodiment, the first embodiment and a prior art with taking a frequency in the horizontal axis and a noise suppression in the vertical axis. With the shown embodiment, a higher noise suppression effect than the first embodiment can be obtained in a frequency range higher than or equal to about 1 MHz.

Figure 12A:
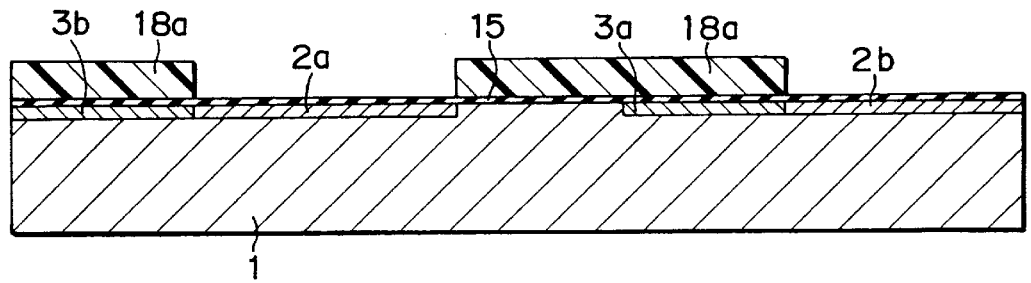
FIGS. 12A to 12D are sections showing respective process steps in a fabrication process of the third embodiment of a semiconductor integrated circuit device according to the present invention in sequential order.

Next, a fabrication process of the third embodiment of a semiconductor integrated circuit device according to the present invention will be discussed. FIGS. 12A to 12D are sections showing process steps in the fabrication process of the third embodiment of a semiconductor integrated circuit device according to the present invention in sequential order. First, an oxide layer 15 is formed over the entire surface of the p-type silicon substrate 1. Then, the oxide layer 15 in a region which is not a region where an n-type buried layer is to be formed is selectively covered with a photoresist. Ion implantation of arsenic is performed in a dosing amount of $5 \times 10^{15}$ to $10 \times 10^{15}$ cm$^{-2}$ with an injection energy of 50 to 70 keV to form n-type buried layers 3a and 3b with taking the photoresist as a mask. Subsequently, the photoresist is removed, and a region which is not a region where the p-type buried layer is to be formed is selectively covered with a photoresist 18a, as shown in FIG. 12A. Then, ion implantation of boron is performed in a dosing amount of $5 \times 10^{15}$ to $10 \times 10^{15}$ cm$^{-2}$ with an injection energy of 50 to 70 keV to form p-type buried layers 2a and 2b with taking the photoresist 18a as a mask.

Figure 12B:
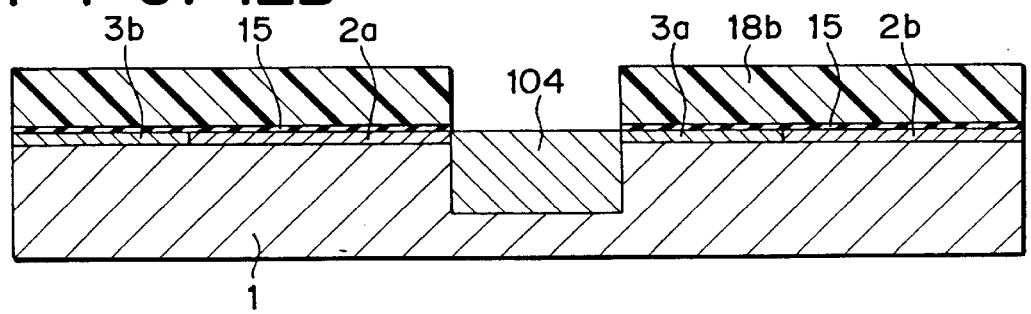
Figure 13:
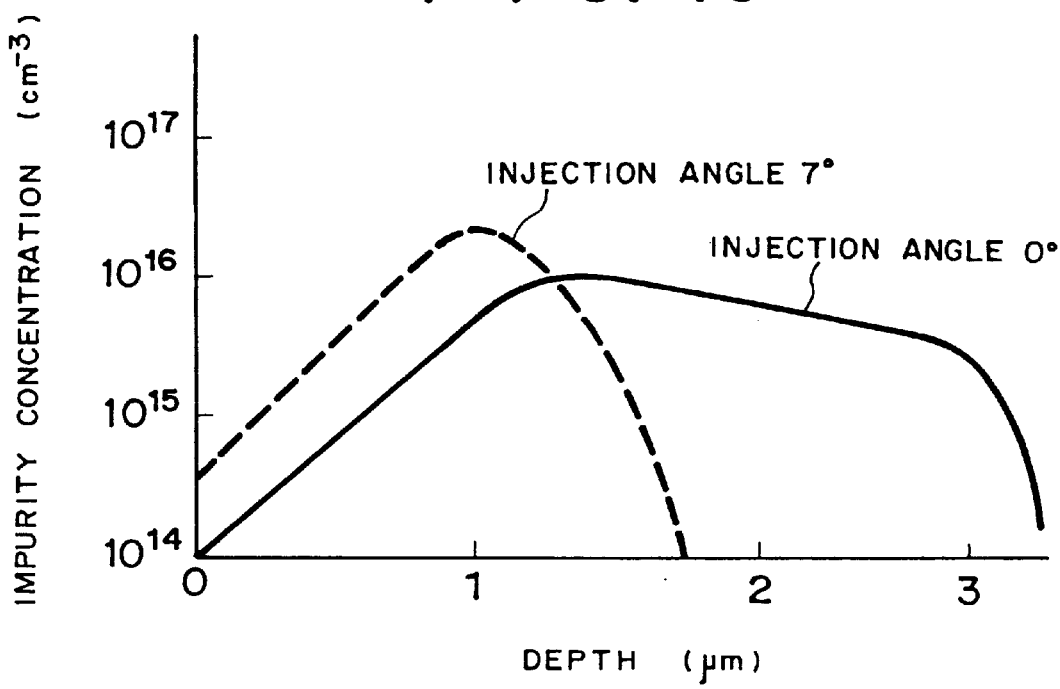
FIG. 13 is a graph showing a relationship between a depth from a surface of a silicon substrate and a impurity concentration with taking the depth in the horizontal axis and the impurity concentration in the vertical axis.

Then, the photoresist 18a is removed. Thereafter, as shown in FIG. 12B, a photoresist 18b is formed over the entire surface. Then, the photoresist 18b and the oxide layer 15 in a region where the isolation region 103 is to be formed, is removed. Then, ion implantation of an impurity, such as phosphorous, having n-type as the opposite conductivity type to that of the p-type silicon substrate 1 is performed in a dosing amount not changing the conductivity type of the p-type silicon substrate 1 in the portion where the photoresist 18b and the oxide layer 15 are removed. Therefore, the surface portion 104 having lower impurity concentration and higher specific resistance than the p-type silicon substrate 1 is formed in the upper portion of the p-type silicon substrate 1. In this process, if the impurity concentration of the p-type silicon substrate 1 is $1 \times 10^{15}$ to $5 \times 10^{15}$ cm$^{-3}$, ion implantation of phosphorous is performed in a dosing amount of $1 \times 10^{11}$ to $5 \times 10^{11}$ cm$^{-2}$ with an injection energy of 300 to 400 keV, a range distance of about 0.4 to 0.5 μm and an injection angle of substantially 0°. Furthermore, ion implantation of phosphorous is performed in a dosing amount of $1 \times 10^{11}$ to $5 \times 10^{11}$ cm$^{-2}$ with an injection energy of 1 to 3 MeV, a range distance of about 3 to 6 μm and an injection angle of substantially 0°. FIG. 13 is a graph showing a relationship between a depth from a surface of a silicon substrate and an impurity concentration with taking the depth in the horizontal axis and the impurity concentration in the vertical axis. When the injection angle is set at 7° as in a prior art, the distribution of impurity concentration becomes non-uniform, and the range distance becomes shallow to be less than 2 μm. On the other hand, when ion implantation is performed with setting the implantation angle at substantially 0°, channeling phenomenon is caused to implant the phosphorous ion in large depth with relatively uniform distribution of concentration.

It should be noted that when the semiconductor substrate is n-type, the ion of p-type conductivity type, for example, boron ion, is implanted.

Figure 12C:
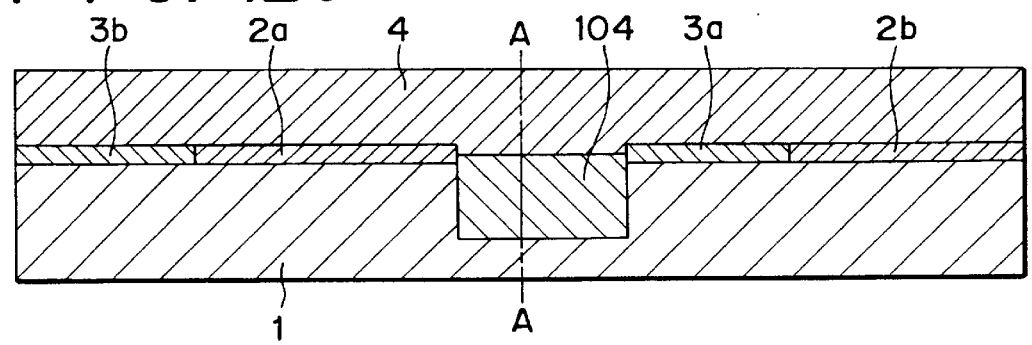

Next, the photoresist 18b is removed and the implanted ion is distributed by performing thermal process in a method of 1000 to 1100° C. of lamp annealing or so forth. Next, the oxide layer 15 is removed. Then, as shown in FIG. 12C, the n-type epitaxial layer 4 is formed over the entire surface. At this time, buried layers 2a, 2b, 3a and 3b, in which high concentration ion is implanted, grows slightly into the n-type epitaxial layer 4.

Figure 14:
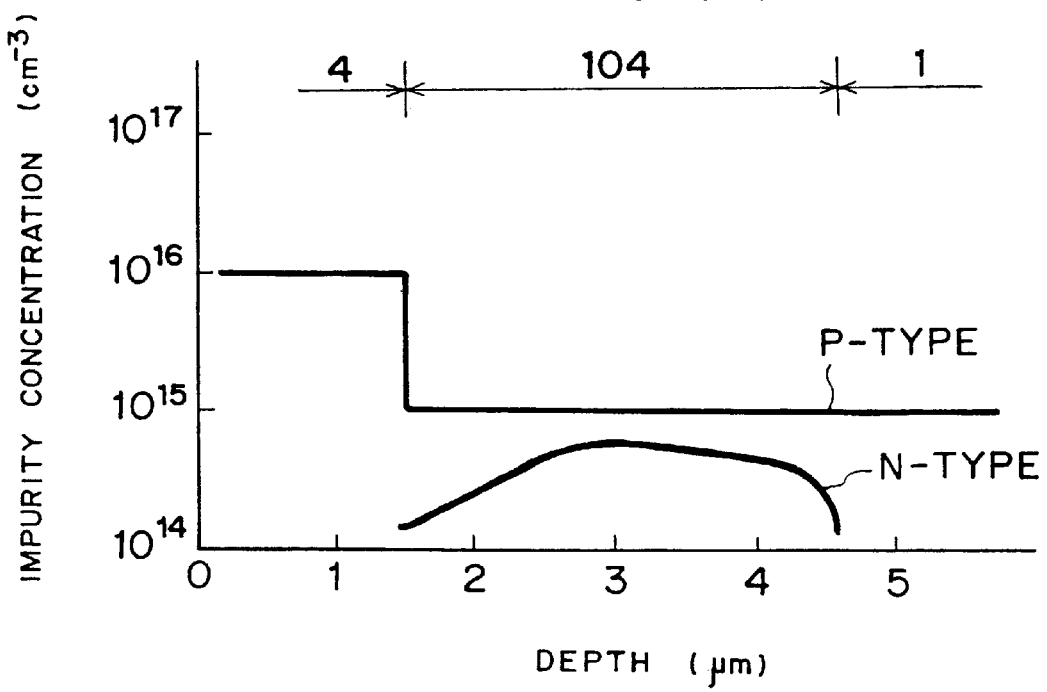
FIG. 14 is a graph showing a relationship between a depth from a surface of an epitaxial layer and an impurity concentration with taking the depth in the horizontal axis and the impurity concentration in the vertical axis.

FIG. 14 is a graph showing a relationship of a depth from the surface of the epitaxial layer and the an impurity concentration with taking the depth in the horizontal axis and the impurity concentration in the vertical axis. The concentration of the p-type impurity is higher than that of the p-type silicon substrate 1 in the depth less than about 1.5 μm where the epitaxial layer 4 is formed. On the other hand, there is the n-type impurity in the region having depth greater than or equal to 1.5 μm and less than 4.6 μm. Thus, resistance in that region becomes lower than that in the p-type silicon substrate 1.

Figure 12D:
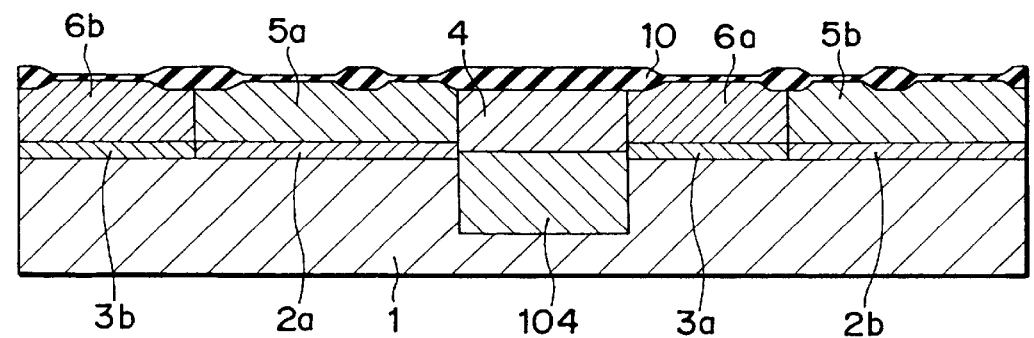

Next, p-type wells 5a and 5b, in which an impurity concentration is adjusted, are formed by performing ion implantation of a p-type impurity only in the epitaxial layer 4 on the p-type buried layers 2a and 2b. On the other hand, n-type wells 6a and 6b, in which an impurity concentration is adjusted, are formed by ion implantation of an n-type impurity only in the epitaxial layer 4 on the n-type buried layers 3a and 3b. Then, as shown in FIG. 12D, a thin oxide layer is formed in a region where MOS transistors and guarding regions are to be formed on the surface of the epitaxial layer. Then, an isolation oxide layer 10 having a greater thickness than the thin oxide layer is formed in a thickness in a range of 300 to 600 nm in the other region. Next, in the conventional method, n-channel MOS transistors are formed on the surfaces of the p-type wells 5a and 5b, and p-channel MOS transistors are formed on the surfaces of the n-type wells 6a and 6b. Also, the semiconductor integrated circuit device is completed by forming a wiring, a backside electrodes and so forth in a conventional method.

Figure 15:
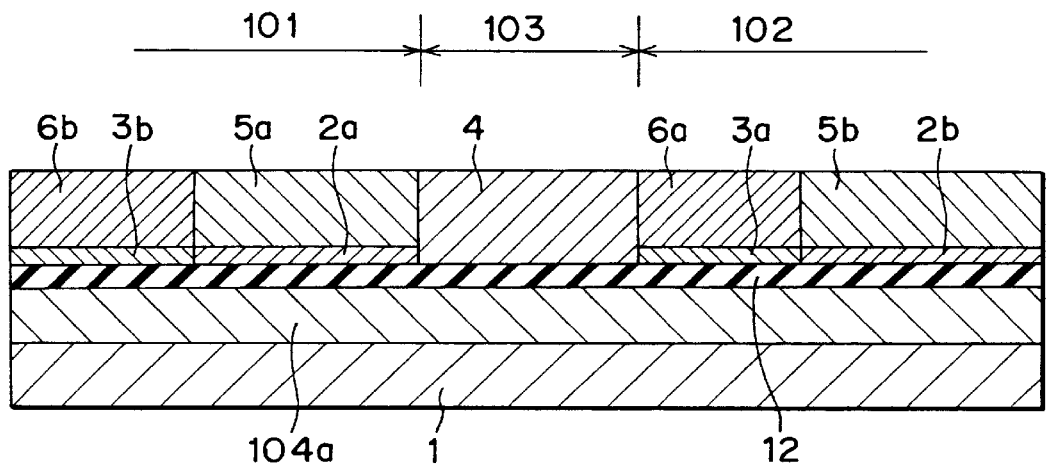
FIG. 15 is a section showing the fourth embodiment of a semiconductor integrated circuit device according to the present invention.

Next, discussion will be given with respect to the fourth embodiment of a semiconductor integrated circuit device according to the present invention. FIG. 15 is a section showing the fourth embodiment of a semiconductor integrated circuit device of the present invention. In FIG. 15, like elements to those in FIG. 4A will be identified by like reference numerals, and detailed description therefor will be neglected. In the shown embodiment, a p-type surface layer 104a having lower impurity concentration than the p-type silicon substrate 1 is formed over the entire surface of a p-type silicon substrate 1. Furthermore, the oxide layer 12 is formed over the entire surface. The p-type buried layer 2a, the n-type buried layer 3b, the p-type well 5a and the n-type well region 6b are formed similarly to the former embodiments on the oxide layer 12 in the digital circuit region 101. On the other hand, the p-type buried layer 2b, the n-type buried layer 3a, the p-type well 5b and the n-type well 6a are formed similarly to the former embodiments on the oxide layer 12 in the analog circuit region. Furthermore, an n-type isolation well region 4 is formed on the oxide layer 12 in the isolation region 103. Thus, the structure of the device is an SOI structure.

The shown embodiment has the SOI structure, in which the oxide layer 12 is formed below the buried layers in respective circuit regions. Furthermore, the surface layer 104a having low impurity concentration and high specific resistance is formed below the oxide layer 12. Therefore, propagation of a charge to be a cause of a noise can be effectively suppressed.

Next, discussion will be given for a fabrication process of the fourth embodiment of a semiconductor integrated circuit device according to the invention. First, over the entire surface of the p-type silicon substrate 1, an n-type impurity, such as phosphorous, having a conductive type opposite to that of the p-type silicon substrate 1 is doped by ion implantation in a dosing amount not changing the conductivity type of the p-type silicon substrate 1 at an injection angle of substantially 0°. Thus, the p-type surface layer 104a having lower impurity concentration than the p-type silicon substrate 1 is formed in a depth of 5 to 10 μm. Subsequently, an oxide layer 12 is formed over the surface layer 104a. Then, by SOI technology, an n-type semiconductor layer is bonded over the entire surface of the oxide layer 12. Then, a photoresist is formed on a region which is not a region where p-type buried layers are to be formed. Ion implantation of a p-type impurity is performed for the region where the photoresist is not formed. Thus, the p-type buried layers 2a and 2b are formed. On the other hand, a photoresist is formed on a region which is not a region where n-type buried layers are to be formed. Ion implantation of an n-type impurity is performed for the region where the photoresist is not formed. Thus, the n-type buried layers 3a and 3b are formed. Also, a photoresist is formed on a region which is not a region where p-type wells are to be formed. Then, ion implantation of a p-type impurity is performed for the region where the photoresist is not formed. Thus the p-type wells 5a and 5b are formed. On the other hand, a photoresist is formed on a region which is not a region where n-type wells are to be formed. Then, ion implantation of an n-type impurity is performed for the region where the photoresist is not formed. Thus, the n-type wells 6a and 6b are formed. At this time, an isolation well region 4 is formed in the isolation region 103, where ion implantation is not performed.

Next, in the similar manner to the fabrication process of the third embodiment of a semiconductor integrated circuit device, MOS transistors and the like are formed to complete a semiconductor integrated circuit device.

Figure 16:
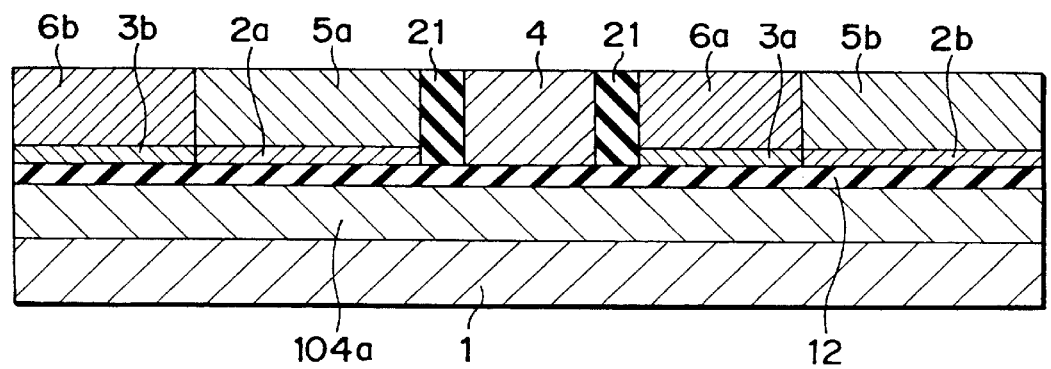
FIG. 16 is a section showing a modification of the fourth embodiment of a semiconductor integrated circuit device according to the present invention.

FIG. 16 is a section showing a modification of the fourth embodiment of a semiconductor integrated circuit device according to the present invention. An insulator 21 may be formed at a portion of the isolation well region 4 in the isolation region 103 in contact with the digital circuit region 101 or the analog circuit region 102. As the insulator 21, silicon oxide may be used, for example. In this case, since the insulator 21 is formed in the isolation region 103, propagation of a charge from the digital circuit region 101 to the analog circuit region 102 across the isolation region 103 can be successfully and effectively prevented.

Figure 17:
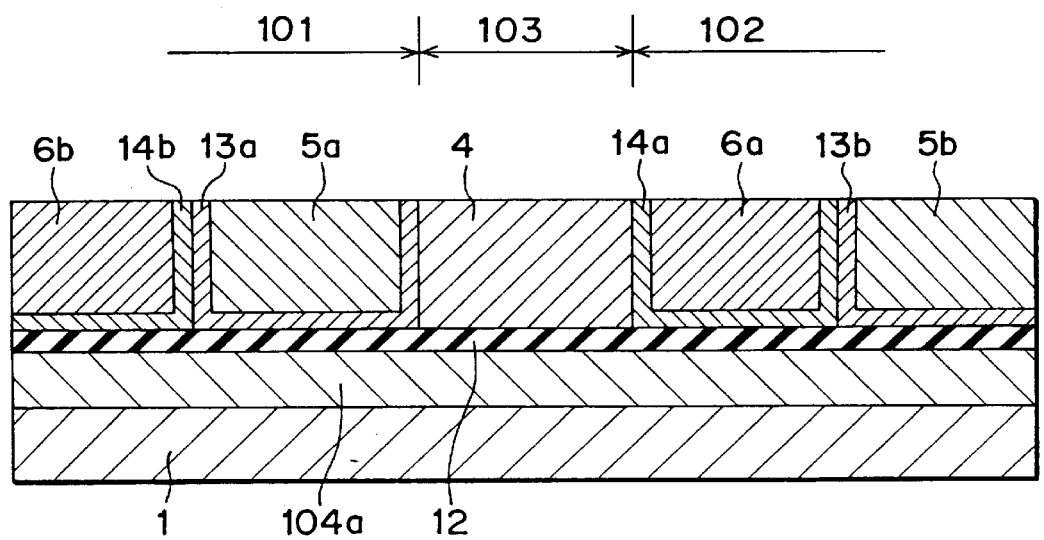
FIG. 17 is a section showing the fifth embodiment of a semiconductor integrated circuit device according to the present invention.

Next, discussion will be given for the fifth embodiment of a semiconductor integrated circuit device according to the present invention. FIG. 17 is a section of the fifth embodiment of a semiconductor integrated circuit device according to the present invention. In FIG. 17, like elements to those in FIG. 15 will be identified by like reference numerals, and detailed description therefor will be neglected. The shown embodiment is different from the fourth embodiment in that n-type high concentration regions 13a and 13b are formed at the bottom surface and the side surface of he p-type wells 5a and 5b respectively, and that p-type high concentration regions 14a and 14b are formed at the bottom surface and the side surface of the n-type wells 6a and 6b respectively.

Figure 18:
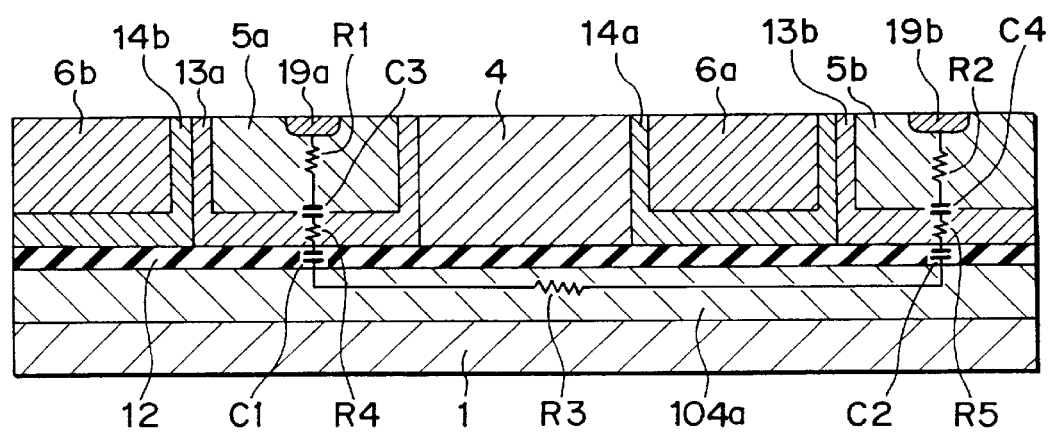
FIG. 18 is a section showing a flow path of a charge.
Figure 19:
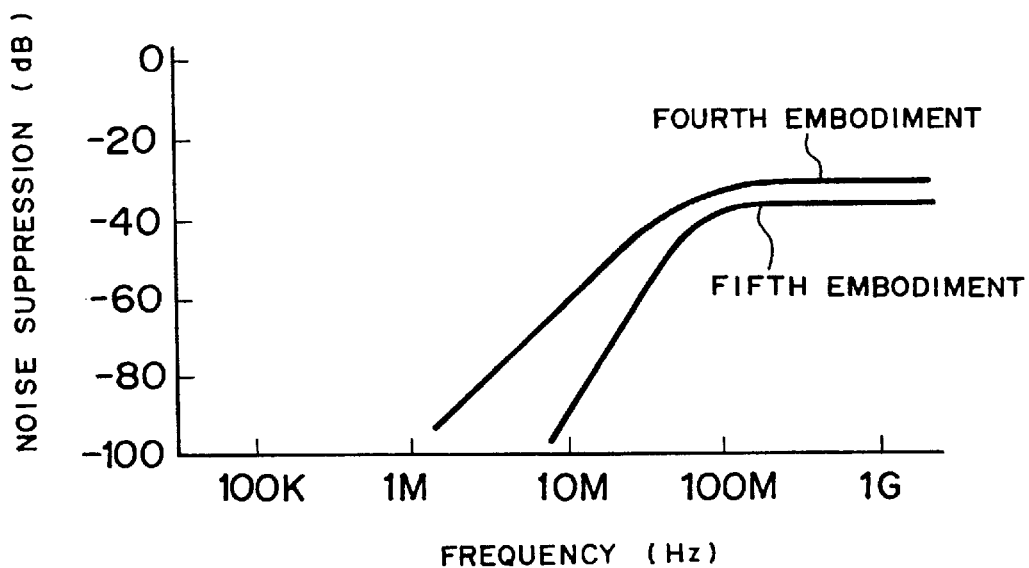
FIG. 19 is a graph showing a difference of noise suppression effects between the fourth embodiment and the fifth embodiment with taking a frequency in the horizontal axis and a noise suppression in the vertical axis.

Even in a semiconductor integrated circuit device having an SOI structure as in the fourth embodiment, when the operation frequency becomes GHz band, a cross-talk suppression effect may be lowered. This is because that impedance in the oxide layer 12 expressed by $1/(\omega C)$, where C is the capacity of the oxide layer, may be lowered according to increasing of the frequency $\omega$. FIG. 18 is a section showing a flow path of a charge. In the fifth embodiment, since high concentration regions 13a, 13b, 14a and 14b having opposite conductivity to the well regions 5a, 5b, 6a and 6b respectively are formed, lowering of the impedance in the oxide layer 12 can be compensated. Therefore, propagation of a charge to be a cause of a noise can be effectively suppressed. Namely, the following elements are present between a lower portion 19a of the n-channel MOS transistor in the digital circuit region, in which a noise is generated, and a lower portion 19b of the n-channel MOS transistor in the analog circuit region, which is influenced by the noise. Resistance R1 in the p-type well 5a, junction capacitance C3 between the p-type well 5a and the high concentration region 13a, resistance R4 in the high concentration region 13a, first capacitance C1 in the oxide layer 12, resistance R3 in the surface layer 104a, second capacitance C2 in the oxide layer 12, resistance R5 in the high concentration region 13b, junction capacitance C4 between the p-type well region 5b and the high concentration region 13b and resistance R2 in the p-type well 5b are present in series. Therefore, in the extent corresponding to reactance consisted of the capacitance C3 and C4 and the resistance R4 and R5, the overall impedance becomes greater than that in the fourth embodiment. Therefore, even when the operation frequency becomes GHz band, a charge propagation suppression effect can be maintained. FIG. 19 is a graph showing a difference of noise suppression effects between the fourth embodiment and the fifth embodiment with taking a frequency in the horizontal axis and a noise suppression in the vertical axis. As shown in FIG. 19, in the fifth embodiment, since the high concentration regions 13a, 13b, 14a and 14b are formed, the noise suppression effect becomes higher than that of the fourth embodiment.

It should be noted that as a modification of the fifth embodiment, each well region may be constructed with a low concentration lower well region and a high concentration upper well region. For example, the impurity concentration of the lower well region is set in a range of $1 \times 10^{15}$ to $1 \times 10^{16}$ cm$^{-3}$ and the impurity concentration of the upper well region is set in a range of $1 \times 10^{16}$ to $1 \times 10^{17}$ cm$^{-3}$. With this modification, since the resistance R1 and R2 in the p-type well regions 5a and 5b become higher, cross-talk can be much effectively suppressed. The lower well region may be required at the bottom surface of the well region. In this case, the high concentration regions 13a, 13b, 14a and 14b are not necessary to form.

On the other hand, when a layer thickness of the oxide layer 12 is greater than or equal to 1 $\mu$m in order to reduce capacitance C1 and C2 in the oxide layer, local strain may be caused in epitaxial layer 4 to lower the yield in the bonding process. Therefore, if the problem of the local strain can be successfully solved, the oxide layer 12 may be formed thicker.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor integrated circuit device with a digital circuit and an analog circuit on a common substrate comprising:
    an integrated circuit substrate, which includes:
        a semiconductor substrate of a first conductivity type;
        a first well region formed at the surface of said integrated circuit substrate, in which said digital circuit is formed;
        a second well region formed at the surface of said integrated circuit substrate, in which said analog circuit is formed; and an isolation region formed between said first well region and said second well region, wherein said isolation region has a width greater than a thickness of said semiconductor substrate.

2. A semiconductor integrated circuit device with a digital circuit and an analog circuit on a common substrate as set forth in claim 1, wherein said integrated circuit substrate has a semiconductor layer above said semiconductor substrate; and said first well region and said second well region are formed in said semiconductor layer.

3. A semiconductor integrated circuit device with a digital circuit and an analog circuit on a common substrate as set forth in claim 2, wherein said first well region comprises:
a first well of the first conductivity type having a first buried layer of the first conductivity type at the bottom of said first well; and
a second well of a second conductivity type having a second buried layer of the second conductivity type at the bottom of said second well, and said second well region comprises:
a third well of the first conductivity type having a third buried layer of the first conductivity type at the bottom of said third well; and
a fourth well of the second conductivity type having a fourth buried layer of the second conductivity type at the bottom of said fourth well.

4. A semiconductor integrated circuit device with a digital circuit and an analog circuit on a common substrate as set forth in claim 3, wherein said first well or said second well located adjacent to said isolation region includes:
a circuit element; and
a fixed potential region formed between said circuit element and said isolation region, and connected to a fixed potential.

5. A semiconductor integrated circuit device with a digital circuit and an analog circuit on a common substrate as set forth in claim 3, wherein said fourth well is located adjacent to said isolation region;

said third well is located adjacent to said fourth well away from said isolation region; and said third well includes:
a circuit element; and
a fixed potential region formed between said circuit element and said fourth well, and connected to a fixed potential.

6. A semiconductor integrated circuit device with a digital circuit and an analog circuit on a common substrate as set forth in claim 5, wherein said fixed potential region is a region containing an impurity of the first conductivity type in high concentration; and resistance between said fixed potential region and said third buried layer is lower than resistance in the third buried layer.

7. A semiconductor integrated circuit device with a digital circuit and an analog circuit on a common substrate as set forth in claim 2, comprising:

a first electrode formed on the backside of a portion of said semiconductor substrate, in which said first well region is located, and applying a substrate potential; and a second electrode formed on the backside of a portion of said semiconductor substrate, in which said second well region is located, and applying a substrate potential.

8. A semiconductor integrated circuit device with a digital circuit and an analog circuit on a common substrate as set forth in claim 2, wherein said integrated circuit substrate has a high specific resistance region at the surface of said semiconductor substrate, having higher specific resistance than that of said semiconductor substrate.

9. A semiconductor integrated circuit device with a digital circuit and an analog circuit on a common substrate as set forth in claim 2, comprising an insulation layer formed between said semiconductor layer and said semiconductor substrate.

10. A semiconductor integrated circuit device with a digital circuit and an analog circuit on a common substrate as set forth in claim 9, wherein said integrated circuit substrate has a high specific resistance region having higher specific resistance than that of said semiconductor substrate on the surface thereof.

11. A semiconductor integrated circuit device with a digital circuit and an analog circuit on a common substrate as set forth in claim 9, wherein said first well region comprises:
a first well of the first conductivity type having a first buried layer of a second conductivity type at the bottom of said first well; and
a second well of the second conductivity type having a second buried layer of the first conductivity type at the bottom of said second well, and said second well region comprises:
a third well of the first conductivity type having a third buried layer of the second conductivity type at the bottom of said third well; and
a fourth well of the second conductivity type having a fourth buried layer of the first conductivity type at the bottom of said fourth well.

12. A semiconductor integrated circuit device with a digital circuit and an analog circuit on a common substrate as set forth in claim 11, wherein said first buried layer extends to the side surface of said first well;

said second buried layer extents to the side surface of said second well;

said third buried layer extends to the side surface of said third well; and said fourth buried layer extends to the side surface of said fourth well.

13. A semiconductor integrated circuit device with a digital circuit and an analog circuit on a common substrate comprising:

an integrated circuit substrate including:
a semiconductor substrate of a first conductivity type;
a semiconductor layer formed above said semiconductor substrate;
a first well region formed at the surface of said semiconductor layer, in which said digital circuit is formed, said first well region including a first well including:
a circuit element; and
a fixed potential region connected to a fixed potential;
a second well region formed at the surface of said semiconductor layer, in which said analog circuit is formed; and an isolation region formed between said first well region and said second well region, to which said first well region is located adjacent, and between which and said circuit element, said fixed potential region is formed.

14. A semiconductor integrated circuit device with a digital circuit and an analog circuit on a common substrate as set forth in claim 13, wherein said second well region includes:
a second well of a second conductivity type located adjacent to said isolation region; and
a third well of the first conductivity type located adjacent to said second well away from said isolation region includes:
a circuit element; and
a fixed potential region formed between said circuit element and said second well, and connected to a fixed potential.

15. A semiconductor integrated circuit device with a digital circuit and an analog circuit on a common substrate as set forth in claim 14, wherein said third well includes a buried layer having high concentration of an impurity of the first conductivity type at the bottom thereof; and said fixed potential region reaches said buried layer.

16. A semiconductor integrated circuit device with a digital circuit and an analog circuit on a common substrate comprising:

an integrated circuit substrate including:
a semiconductor substrate of a first conductivity type;
a semiconductor layer above said semiconductor substrate;
a first well region formed at the surface of said semiconductor layer, in which said digital circuit is formed;
a second well region formed at the surface of said semiconductor layer, in which said analog circuit is formed;
an isolation region formed between said first well region and said second well region;
a first electrode formed on the backside of a portion of said semiconductor substrate, in which said first well region is located; and
a second electrode formed on the backside of a portion of said semiconductor substrate, in which said second well region is located.

17. A semiconductor integrated circuit device with a digital circuit and an analog circuit on a common substrate comprising:

an integrated circuit substrate including:
a semiconductor substrate of a first conductivity type;
a semiconductor layer formed on said semiconductor substrate;
a first well region formed at the surface of said semiconductor layer, in which said digital circuit is formed, said first well region including:
a first well of the first conductivity type; and
a second well of a second conductivity type;
a second well region formed at the surface of said semiconductor layer, in which said analog circuit is formed, said second well region including:
a third well of the first conductivity type; and
a fourth well of the second conductivity type;
an isolation region formed between said first well region and said second well region, to which said first well and said fourth well are located adjacent.

18. A semiconductor integrated circuit device with a digital circuit and an analog circuit on a common substrate comprising:

an integrated circuit substrate including:
a semiconductor substrate of a first conductivity type;
an insulation layer formed on said semiconductor substrate;
a semiconductor layer formed on said insulation layer;
a first well region formed at the surface of said semiconductor layer, in which said digital circuit is formed;
a second well region formed at the surface of said semiconductor layer, in which said analog circuit is formed; and
an isolation region formed between said first well region and said second well region,
wherein said semiconductor substrate has a low impurity concentration layer having lower impurity concentration than that of said semiconductor substrate over the entire surface.

19. A semiconductor integrated circuit device with a digital circuit and an analog circuit on a common substrate as set forth in claim 18, wherein said isolation region includes an insulator reaching said insulation layer from the surface thereof.

20. A semiconductor integrated circuit device with a digital circuit and an analog circuit on a common substrate comprising:

an integrated circuit substrate including:
a semiconductor substrate of a first conductivity type;
an insulation layer formed on said semiconductor substrate;
a semiconductor layer formed on said insulation layer;
a first well region formed at the surface of said semiconductor layer, in which said digital circuit is formed;
a second well region formed at the surface of said semiconductor layer, in which said analog circuit is formed; and
an isolation region formed between said first well region and said second well region, wherein said first well region includes:
a first well of the first conductivity type having a first buried layer of second conductivity type at the bottom of said first well; and
a second well of the second conductivity type having a second buried layer of the first conductivity type at the bottom of said second well, and said second well region includes:
a third well of the first conductivity type having a third buried layer of second conductivity type at the bottom of said third well; and
a fourth well of the second conductivity type having a fourth buried layer of the first conductivity type at the bottom of said fourth well.

* * * * *